United States Patent
Tortorelli et al.

(10) Patent No.: US 12,367,933 B2
(45) Date of Patent: Jul. 22, 2025

(54) UNIPOLAR PROGRAMMING OF MEMORY CELLS

(71) Applicant: Micron Technology, Inc., Boise, ID (US)

(72) Inventors: Innocenzo Tortorelli, Cernusco Sul Naviglio (IT); Mattia Robustelli, Milan (IT); Alessandro Sebastiani, Piacenza (IT); Matteo Impala', Milan (IT); Fabio Pellizzer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 149 days.

(21) Appl. No.: 17/868,750

(22) Filed: Jul. 19, 2022

(65) Prior Publication Data

US 2024/0029796 A1    Jan. 25, 2024

(51) Int. Cl.
G11C 13/00    (2006.01)
G11C 16/04    (2006.01)
G11C 16/10    (2006.01)
G11C 16/20    (2006.01)

(52) U.S. Cl.
CPC ........ *G11C 16/102* (2013.01); *G11C 13/0069* (2013.01); *G11C 16/0425* (2013.01); *G11C 16/20* (2013.01)

(58) Field of Classification Search
CPC .... G11C 16/102; G11C 16/0425; G11C 16/20
See application file for complete search history.

(56) References Cited

U.S. PATENT DOCUMENTS

| 3,321,749 | A  | * | 5/1967  | Overn ............... G11C 11/06014 365/206 |
| 7,307,268 | B2 | * | 12/2007 | Scheuerlein ....... G11C 13/0069 257/3 |
| 8,885,399 | B2 | * | 11/2014 | Storms .............. G11C 13/0069 365/163 |
| 9,349,948 | B2 | * | 5/2016  | Chen ................. G11C 13/0069 |
| 9,406,359 | B2 | * | 8/2016  | Park ...................... G11C 29/42 |
| 10,803,939 | B2 |   | 10/2020 | Castro et al. |
| 11,217,308 | B1 |   | 1/2022  | Robustelli et al. |
| 2007/0285968 | A1 | * | 12/2007 | Toda .................... G11C 17/165 365/148 |
| 2011/0103128 | A1 | * | 5/2011  | Kanno ............... G11C 13/0064 365/189.16 |
| 2011/0228585 | A1 | * | 9/2011  | Kim ........................ G11C 8/08 365/148 |
| 2012/0147646 | A1 | * | 6/2012  | Scheuerlein ........... H10B 63/80 365/191 |
| 2016/0372196 | A1 | * | 12/2016 | Chen .................. G11C 13/0097 |
| 2024/0046986 | A1 | * | 2/2024  | Choi ..................... H10B 63/10 |

* cited by examiner

*Primary Examiner* — Khamdan N. Alrobaie

(74) *Attorney, Agent, or Firm* — Brooks, Cameron & Huebsch, PLLC

(57) ABSTRACT

Systems, methods, and apparatuses are provided for unipolar programming of memory cells in a semiconductor device. A memory has a plurality of self-selecting memory cells and circuitry configured to program a self-selecting memory cell of the plurality of self-selecting memory cells to a first data state or a second data state by applying a current pulse to the self-selecting memory cell. The current is a set pulse or a reset pulse. The set pulse and the reset pulse have a same polarity.

23 Claims, 6 Drawing Sheets

UNIPOLAR PROGRAMMING OF MEMORY CELLS

TECHNICAL FIELD

The present disclosure relates generally to semiconductor memory and methods, and more particularly, to unipolar programming of memory cells.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

Resistance variable memory devices can include resistance variable memory cells that can store data based on the resistance state of a storage element (e.g., a memory element having a variable resistance). As such, resistance variable memory cells can be programmed to store data corresponding to a target data state by varying the resistance level of the memory element. Resistance variable memory cells can be programmed to a target data state (e.g., corresponding to a particular resistance state) by applying sources of an electrical field or energy, such as positive or negative electrical pulses (e.g., positive or negative voltage or current pulses) to the cells (e.g., to the memory element of the cells) for a particular duration. A state of a resistance variable memory cell can be determined by sensing current flowing through the cell responsive to an applied interrogation voltage. The sensed current, which varies based on the resistance level of the cell, can indicate the state of the cell.

Various memory arrays can be organized in various architectures, such as a vertical pillar architecture with memory cells (e.g., resistance variable cells) arranged in word line layers, or a cross-point architecture with memory cells (e.g., resistance variable cells) being located at intersections of a first and second signal lines used to access the cells (e.g., at intersections of access lines and sense lines). Some resistance variable memory cells can comprise a select element (e.g., a diode, transistor, or other switching device) in series with a storage element (e.g., a phase change material, metal oxide material, and/or some other material programmable to different resistance levels). Some resistance variable memory cells, which may be referred to as self-selecting memory cells, can comprise a single material which can serve as both a select element and a storage element for the memory cell.

DETAILED DESCRIPTION

Figure 1:
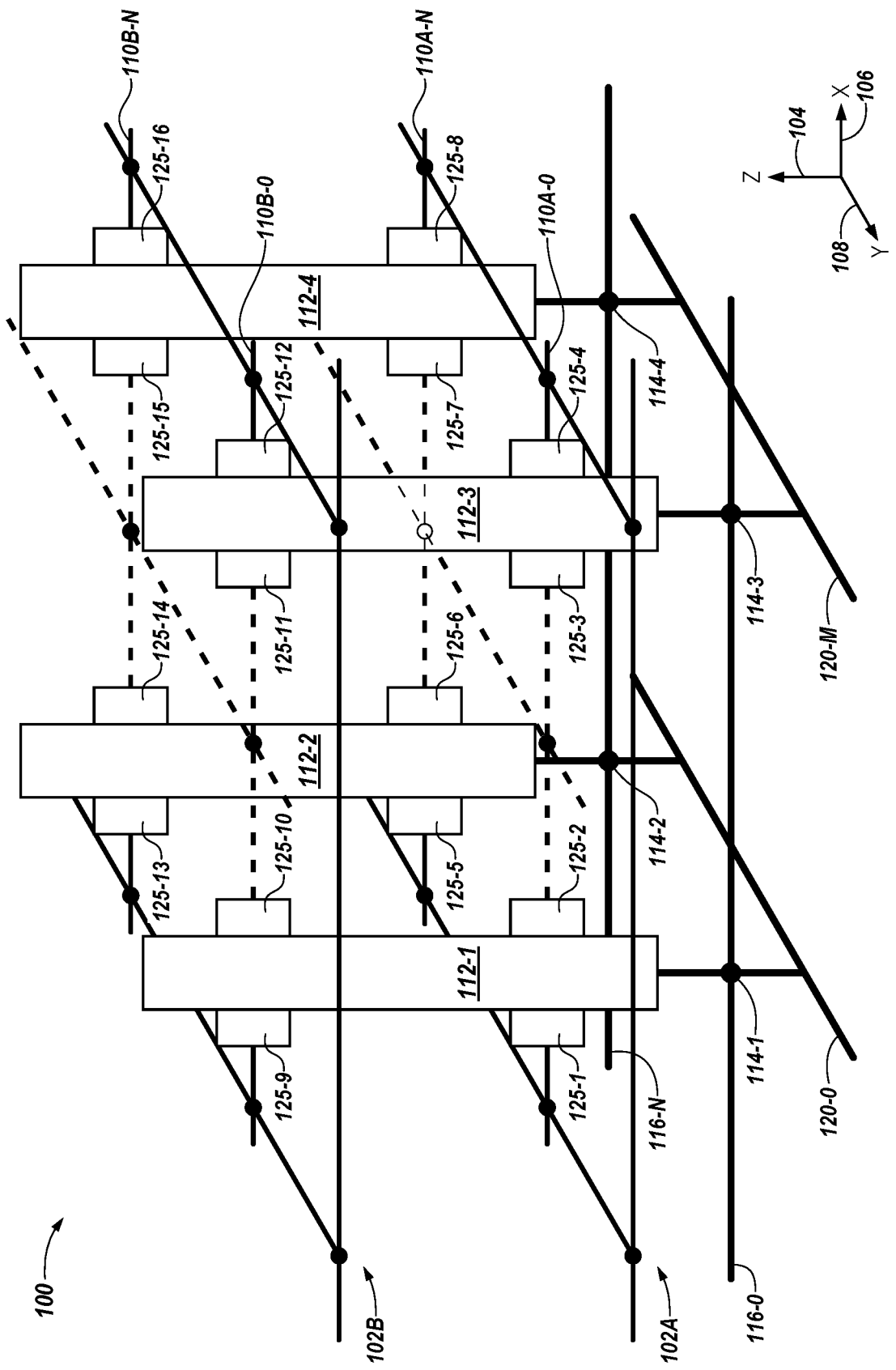
FIG. 1 is a three-dimensional view of a portion of an example of a memory array, in accordance with an embodiment of the present disclosure.

The present disclosure includes apparatuses, methods, and systems for unipolar programming of memory cells. An embodiment includes a memory having a plurality of self-selecting memory cells, and circuitry configured to program a self-selecting memory cell of the plurality of self-selecting memory cells to a first data state or a second data state by applying a current pulse to the self-selecting memory cell, wherein the current pulse is a set pulse or a reset pulse, and the set pulse and the reset pulse have the same polarity.

As discussed further herein, when performing a program operation on a resistance variable memory cell, such as a self-selecting memory cell, in accordance with the present disclosure, a current pulse of a single (e.g., only one) polarity can be applied to the memory cell. For example, only a positive current or only a negative current may be applied to the cell (e.g., for memory cells coupled to a same sense line (e.g., bit line)) during the program operation. The application of the single polarity current pulse (e.g., of only a positive current or a negative current), which may be part of and/or referred to as a unipolar program operation, may cause a memory cell, depending on which data state that memory cell is programed to, to switch data states.

Embodiments of the present disclosure can provide benefits, such as programming different memory cells to different data states (e.g., programming a first self-selecting memory cell to a first data state and a second self-selecting memory cell to a second data state) concurrently in the same memory tile. This approach can save time and energy in comparison to other approaches to programming memory cells that utilize bipolar current pulses (e.g., in which both a positive current pulse and a negative current pulse are applied to the cell). For example, in such previous approaches, memory cells in a tile cannot be programmed to different data states concurrently because the different data states in other approaches correspond to different polarities and a memory tile can only be programmed to one polarity at a time. However, since embodiments of the present disclosure can program multiple memory cells in a single tile to different data states concurrently, systems implementing the present disclosure can save the time and energy involved with switching the polarity of a memory tile when a memory cell is programmed to a different data state.

As used herein, "a," "an," or "a number of" can refer to one or more of something, and "a plurality of" can refer to two or more such things. For example, a memory device can refer to one or more memory devices, and a plurality of memory devices can refer to two or more memory devices. Additionally, the designators "N" and "M," as used herein, particularly with respect to reference numerals in the drawings, indicates that a number of the particular feature so designated can be included with a number of embodiments of the present disclosure.

The figures herein follow a numbering convention in which the first digit or digits correspond to the figure number of the drawing and the remaining digits identify an element or component in the drawing. Similar elements or components between different figures may be identified by the use of similar digits. For example, reference numeral 125 may reference element "25" in FIG. 1, and a similar element may be referenced as 425 in FIG. 4. Analogous elements within one figure may be referenced with a reference numeral followed by a hyphen and another numeral or a letter. For example, 112-1 may reference element 112-1 in FIGS. 1 and 112-2 may reference element 112-2, which may be analogous to element 112-1. Such analogous elements may be generally referenced without the hyphen and extra numeral or letter. For example, elements 112-1, 112-2, 112-3 and 112-4 or other analogous elements may be generally referenced as 112.

FIG. 1 is a three-dimensional view of a portion of an example of a memory array 100 (e.g., a three-dimensional vertical pillar memory array), in accordance with an embodiment of the present disclosure. Memory array 100 may include a plurality of first signal lines (e.g., first access lines), which may be referred to as access lines 110A-0 to 110A-N and 110B-0 to 110B-N, and a plurality of second signal lines (e.g., second access lines), which may be referred to as sense (e.g., digit or bit) lines 120-0 to 120-M.

FIG. 1 shows a plurality of planes 102A, 102B (e.g., layers or levels). While two planes are shown in FIG. 1, embodiments are not so limited, and may include more than two planes. As shown in FIG. 1, the planes 102A, 102B are separated in a z-direction 104 (e.g., separated vertically) from one another. FIG. 1 further illustrates an x-direction 106 (e.g., a first horizontal direction) and a y-direction 108 (e.g., a second horizontal direction). While not shown in FIG. 1, for clarity and so as not to obscure embodiments of the present disclosure, components of the memory array 100, as well as different layers of the memory array 100 may be separated by an insulation material (e.g., a dielectric material).

The memory array 100 may include a number of conductive pillars 112-1, 112-2, 112-3, 112-4. The conductive pillars 112-1, 112-2, 112-3, 112-4 can comprise a metallic (or semi-metallic) material or a semiconductor material such as a doped polysilicon material, among others. Various types of conductive pillars may be utilized. For instance, the conductive pillars 112-1, 112-2, 112-3, 112-4 may be tubular, or have other shapes. The conductive pillars 112-1, 112-2, 112-3, 112-4 may have a hollow center or a solid center, for example.

As shown in FIG. 1, each of the conductive pillars 112-1, 112-2, 112-3, 112-4 may be respectively coupled to a sense line 120-0 to 120-M via a select element 114-1, 114-2, 114-3, 114-4 (e.g., switch). An example of the select element is a thin-film transistor (tft); however, embodiments are not so limited. The select element 114-1, 114-2, 114-3, 114-4 can be driven by a gate line 116-0 to 116-N, for example. Activating (e.g., biasing) a select element 116 coupled to a particular conductive pillar 112 may provide that an operation (e.g., a sense operation or a programming operation) may be performed on one or more memory cells coupled to the particular conductive pillar 112.

As shown in FIG. 1, the memory array 100 includes a number of memory cells 125-1 to 125-16. Each of the memory cells 125-1 to 125-16 can be coupled to one of the first signal lines 110. For instance, as shown in FIG. 1, memory cells 125-1 to 125-4 are coupled to first signal line 110A-0, while memory cells 125-13 to 125-16 are coupled to first signal line 110B-N. Each of the memory cells 125-1 to 125-16 can be coupled to one of the conductive pillars 112. For instance, as shown in FIG. 1, memory cells 125-1 and 125-2 are coupled to conductive pillar 112-1, while memory cells 125-15 and 125-16 are coupled to conductive pillar 112-4. Each of the memory cells 125-1 to 125-16 can be coupled to one of the second signal lines 120. For instance, as shown in FIG. 1, memory cells 125-1, 125-2, 125-5, 125-6, 125-9, 125-10, 125-13 and 125-14 are coupled to second signal line 120-0, while memory cells 125-3, 125-4, 125-7, 125-8, 125-11, 125-12, 125-15 and 125-16 are coupled to second signal line 120-M. The memory cells 125 may be programmable to one of two different data states using unipolar current pulses, as will be further described further herein.

The memory cells 125 may be resistance variable memory cells, for example. The memory cells 125 may include a material programmable to different data states (e.g., a set state or a reset state). In some examples, each of memory cells 125 may include a single material, between a top electrode (e.g., top plate) and a bottom electrode (e.g., bottom plate), that may serve as a select element (e.g., a switching material) and a storage element, so that each memory cell 125 may act as both a selector device and a memory element. Such a memory cell 125 may be referred to herein as a self-selecting memory cell 125. For example, each memory cell 125 may include a chalcogenide material that may be formed of various doped or undoped materials, that may or may not be a phase-change material, and/or that may or may not undergo a phase change during reading and/or writing the memory cell. Chalcogenide materials (e.g., chalcogenide storage materials) may be materials or alloys that include at least one of the elements S, Se, and Te. Chalcogenide materials may include alloys of S, Se, Te, Ge, As, Al, Sb, Au, Si, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. Example chalcogenide materials can also include SAG-based glasses NON phase change materials such as SeAsGe. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer.

In various embodiments, the threshold voltages of memory cells 125 may snap back in response to a magnitude of an applied voltage differential across them exceeding their threshold voltages. Such memory cells may be referred to as snapback memory cells. For example, a memory cell 125 may change (e.g., snap back) from a non-conductive (e.g., high impedance) state to a conductive (e.g., lower impedance) state in response to the applied voltage differential exceeding the threshold voltage. For example, a memory cell snapping back may refer to the memory cell transitioning from a high impedance state to a lower impedance state responsive to a voltage differential applied across the memory cell 125 being greater than the threshold voltage of the memory cell 125. A threshold voltage of a memory cell 125 snapping back may be referred to as a snapback event, for example.

A memory device (e.g., memory device 592 in FIG. 5) can include a memory having a plurality of self-selecting memory cells 125 and circuitry (e.g., controller 593 in FIG. 5) configured to program a self-selecting memory cell 125 of the plurality of self-selecting memory cells 125 to a first data state or a second data state by applying a current pulse to the self-selecting memory cell 125. In some embodiments, the current pulse can be a set pulse or a reset pulse. Further, in some embodiments, the set pulse and reset pulse can have the same polarity. For example, the set pulse and current pulse can both have a positive polarity or both have a negative polarity.

In some embodiments, the duration of the set pulse can be greater than or equal to the duration of the reset pulse and the set pulse can have a lower magnitude than the reset pulse. In some embodiments, programming the minimum duration of the set pulse to be equal to the minimum duration of the reset pulse can minimize the write latency of a command received by the memory device and maximize the write throughput of the command received by the memory device. As used herein, the term "write latency" refers to the amount of time it takes for data to be returned to the memory component that sent the command during a read command or for the write acknowledgement to return to the memory component that sent the command during a write command. As used herein, the term "write throughput" refers to an amount of data the command can write to a memory device over a period of time. In some embodiments, increasing the set pulse to have a greater duration than the reset pulse will increase the write latency of the command but improve the signal window of the command. As used herein, the term "signal window" refers to a difference between the magnitude of the high reference voltage of a memory cell and the magnitude of the low reference voltage of a memory cell.

In some embodiments, the circuitry of the memory device can be configured to program the self-selecting memory cell 125 to a first data state by applying the set pulse to the self-selecting memory cell 125 and program the self-selecting memory cell to the second data state by applying the reset pulse to the self-selecting memory cell 125. That is, applying the set pulse to the memory cell can program the cell to the first data state (e.g., state 0), and applying the reset current pulse to the memory cell can program the cell to the second data state (e.g., state 1). The memory cell 125 can be programmed to the first data state or the second data state based on a magnitude of the current pulse applied to the memory cell 125. For example, the memory cell 125 can be programmed to the first data state when the magnitude of the current pulse is below a specified threshold magnitude. Further, the memory cell 125 can be programmed to the second data state when the magnitude of the current pulse is above the specified threshold magnitude.

The architecture of memory array 100 may be referred to as a three-dimensional vertical pillar architecture having a plurality of vertically oriented (e.g., vertical) conductive pillars and a plurality of horizontally oriented (e.g., horizontal) access lines, as illustrated in FIG. 1. Embodiments of the present disclosure, however, are not limited to the example memory array architecture illustrated in FIG. 1. For example, embodiments of the present disclosure can include a cross-point architecture with memory cells (e.g., resistance variable cells) being located at intersections of a first and second signal lines used to access the cells (e.g., at topological cross-points between of word lines and bit lines). That is, embodiments of the present disclosure can include a three-dimensional cross-point memory array.

Further, in some architectures (not shown), a plurality of first access lines may be formed on parallel planes or tiers parallel to a substrate. The plurality of first access lines may be configured to include a plurality of holes to allow a plurality of second access lines formed orthogonally to the planes of first access lines, such that each of the plurality of second access lines penetrates through a vertically aligned set of holes (e.g., the second access lines vertically disposed with respect to the planes of the first access lines and the horizontal substrate). Memory cells including a storage element (e.g., self-selecting memory cells including a chalcogenide material) may be formed at the crossings of first access lines and second access lines (e.g., spaces between the first access lines and the second access lines in the vertically aligned set of holes). In a similar fashion as described above, the memory cells (e.g., self-selecting memory cells including a chalcogenide material) may be operated (e.g., read and/or programmed) by selecting respective access lines and applying voltage or current pulses.

Figure 2A:
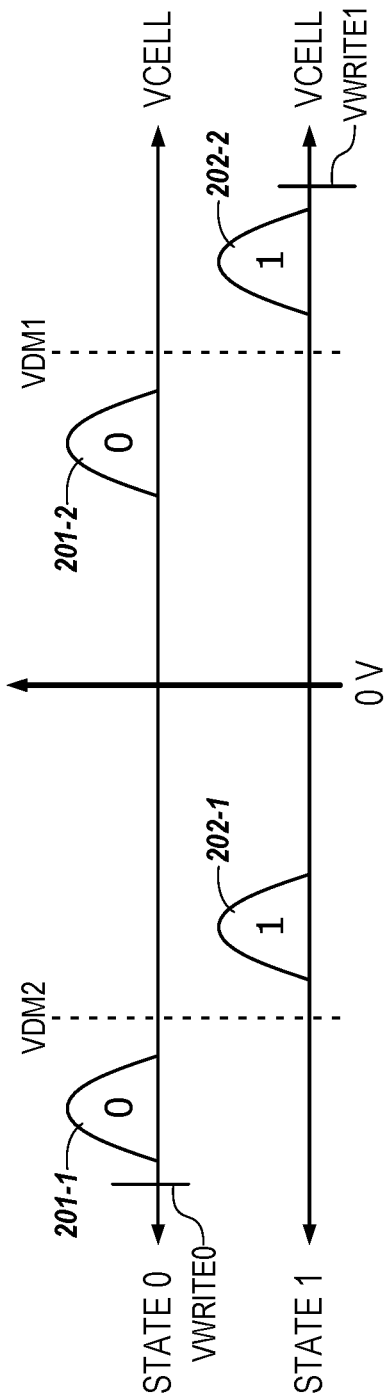
FIG. 2A illustrates threshold voltage distributions associated with various states of a memory cell, in accordance with an embodiment of the present disclosure.

FIG. 2A illustrates threshold distributions associated with various states of a memory cell, such as a memory cell 125 illustrated in FIG. 1, in accordance with an embodiment of the present disclosure. For instance, as shown in FIG. 2A, the memory cell can be programmed to one of two possible data states (e.g., state 0 or state 1). That is, FIG. 2A illustrates threshold voltage distributions associated with two possible data states to which a memory cell can be programmed.

In FIG. 2A, the voltage VCELL may correspond to a voltage differential applied to (e.g., across) the memory cell, such as the difference between a sense line voltage (e.g., bit line voltage (VBL)) and an access line voltage (word line voltage (VWL)) (e.g., VCELL=VBL−VWL). The threshold voltage distributions (e.g., ranges) 201-1, 201-2, 202-1, and 202-2 may represent a statistical variation in the threshold voltages of a memory cell programmed to a particular data state. The distributions illustrated in FIG. 2A correspond to the current versus voltage curves described further in conjunction with FIGS. 2B and 2C, which illustrate snapback asymmetry associated with assigned data states.

Figure 2B:
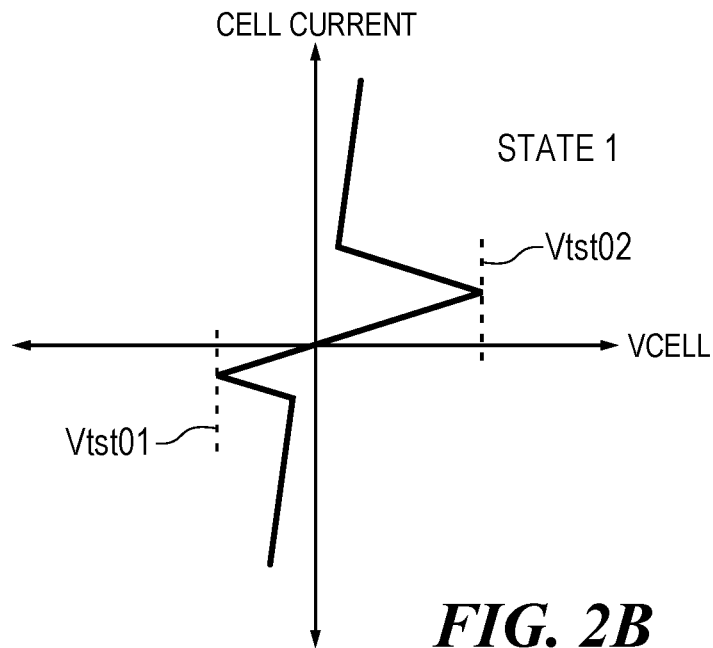
FIG. 2B is an example of a current-versus-voltage curve corresponding to a memory state of FIG. 2A, in accordance with an embodiment of the present disclosure.
Figure 2C:
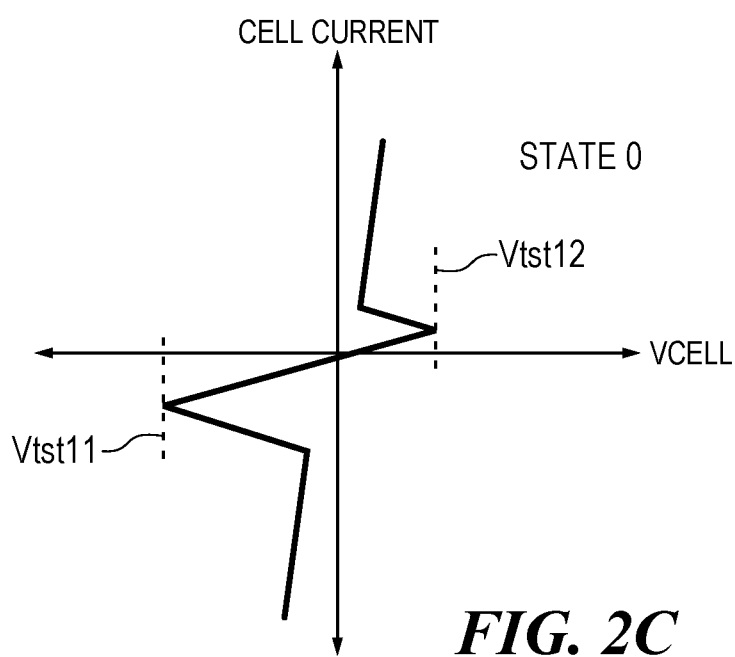
FIG. 2C is an example of a current-versus-voltage curve corresponding to another memory state of FIG. 2A, in accordance with an embodiment of the present disclosure.

In some examples, the magnitudes of the threshold voltages of a memory cell 125 in a particular state may be asymmetric for different polarities, as shown in FIGS. 2A, 2B and 2C. For example, the threshold voltage of a memory cell 125 programmed to state 0 or state 1 may have a different magnitude in one polarity than in an opposite polarity. For instance, in the example illustrated in FIG. 2A, a first data state (e.g., state 0) may be associated with a first asymmetric threshold voltage distribution (e.g., threshold voltage distributions 201-1 and 201-2) whose magnitude is greater for a negative polarity than a positive polarity, and a second data state (e.g., state 1) may be associated with a second asymmetric threshold voltage distribution (e.g., threshold voltage distributions 202-1 and 202-2) whose magnitude is greater for a positive polarity than a negative polarity. In such an example, an applied voltage magnitude sufficient to cause a memory cell 125 to snap back may be different (e.g., higher or lower) for one applied voltage polarity than the other.

FIG. 2A illustrates demarcation voltages VDM1 and VDM2, which may be used to determine the state of a memory cell (e.g., to distinguish between states as part of a read operation). In this example, VDM1 may be a positive voltage used to distinguish cells in state 0 (e.g., in threshold voltage distribution 201-2) from cells in state 1 (e.g., threshold voltage distribution 202-2). Similarly, VDM2 may be a negative voltage used to distinguish cells in state 1 (e.g., threshold voltage distribution 202-1) from cells in state 0 (e.g., threshold voltage distribution 201-1). In the examples of FIGS. 2A-2C, a memory cell 125 in a positive state 1 may not snap back in response to applying VDM1; a memory cell 125 in a positive state 0 may snap back in response to applying VDM1; a memory cell 125 in a negative state 1 may snap back in response to applying VDM2; and a memory cell 125 in a negative state 0 may not snap back in response to applying VDM2.

Embodiments are not limited to the example shown in FIG. 2A. For example, the designations of state 0 and state 1 can be interchanged (e.g., distributions 201-1 and 201-2 may be designated as state 1 and distributions 202-1 and 202-2 may be designated as state 0).

FIGS. 2B and 2C are examples of current-versus-voltage curves corresponding to the memory states of FIG. 2A, in accordance with an embodiment of the present disclosure. As such, in this example, the curves in FIGS. 2B and 2C may correspond to cells in which state 1 is designated as the higher threshold voltage state in a particular polarity (positive polarity direction in this example), and in which state 0 is designated as the higher threshold voltage state in the opposite polarity (negative polarity direction in this example). As noted above, the state designation can be interchanged such that state 0 could correspond to the higher threshold voltage state in the positive polarity direction with state 1 corresponding to the higher threshold voltage state in the negative direction.

FIGS. 2B and 2C illustrate memory cell snapback as described herein. VCELL may represent an applied voltage across the memory cell. For example, VCELL may be a voltage applied to a top electrode corresponding to the memory cell minus a voltage applied to a bottom electrode corresponding to the memory cell (e.g., via a respective access line and sense line). As shown in FIG. 2B, responsive to an applied positive polarity voltage (VCELL), a memory cell programmed to state 1 (e.g., threshold voltage distribution 224) is in a non-conductive state until VCELL reaches voltage Vtst01, at which point the memory cell transitions to a conductive (e.g., lower resistance) state. This transition may be referred to as a snapback event, which occurs when the voltage applied across the memory cell (in a particular polarity) exceeds the memory cell's threshold voltage. Accordingly, voltage Vtst01 may be referred to as a snapback voltage. In FIG. 2B, voltage Vtst01 may correspond to a snapback voltage for a memory cell programmed to state 1 (e.g., threshold voltage distribution 224).

Similarly, as shown in FIG. 2C, responsive to an applied positive polarity voltage (VCELL), a memory cell programmed to state 0 (e.g., threshold voltage distribution 222) may be in a non-conductive state until VCELL reaches voltage Vtst11, at which point the memory cell may snap back to a conductive (e.g., lower resistance) state. As shown in FIG. 2C, the voltage Vtst11 can have a lower magnitude than Vtst01 in FIG. 2B.

In various instances, a snapback event may result in a memory cell switching states. For instance, if a VCELL exceeding Vtst01 is applied to a state 1 cell, the resulting snapback event may reduce the threshold voltage of the memory cell to a level below VDM, which would result in the cell being read as state 0 (e.g., threshold voltage distribution 222). As such, in a number of embodiments, a snapback event may be used to write a memory cell to the opposite state (e.g., from state 1 to state 0 and vice versa). Although the currents in FIGS. 2B and 2C are shown to each have a positive polarity, the currents in FIGS. 2B and 2C can each instead have a negative polarity.

In an embodiment of the present disclosure, a memory cell, such as memory cells 125 illustrated in FIG. 1, may be programmed to one of two possible data states (e.g., state 0 or state 1) by applying a current pulse to the memory cell. For example, the memory cell can be programmed by applying a first current pulse or a second current pulse to the memory cell. The first current pulse can be a pulse to be applied to the memory cell for a longer amount of time than the second current pulse would be applied to the memory cell, and/or with a lower amplitude than the second current pulse. Further, the first current pulse and the second current pulse can have the same polarity. Examples of such current pulses will be further described herein (e.g., in connection with FIGS. 3A-3B).

Figure 3A:
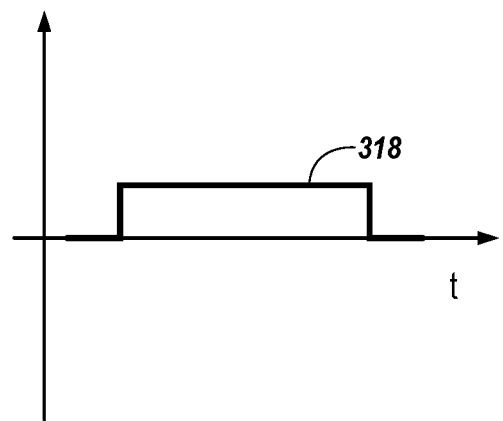
FIGS. 3A-3B are examples of current pulses for programming memory cells in accordance with an embodiment of the present disclosure.
Figure 3B:
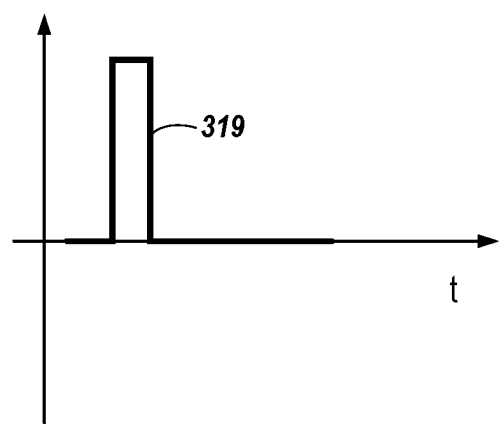

FIGS. 3A-3B are examples of current pulses 318 and 319 for programming memory cells (e.g., memory cells 125 previously described in connection with FIG. 1) in accordance with an embodiment of the present disclosure. In some embodiments, FIG. 3A illustrates a current pulse 318 with a particular polarity and FIG. 3B illustrates a current pulse 319 with the same polarity of the current pulse 318. That is, current pulses 318 and 319 can be unipolar current pulses. For example, as shown in FIGS. 3A-3B, current pulses 318 and 319 may both have a positive polarity. In other embodiments, the current pulses 318 and 319 can both have a negative polarity.

In some embodiments, the current pulse 318 may be a set pulse and the current pulse 319 may be a reset pulse. In some embodiments, applying the current pulse 318 to the memory cell may program the memory cell to a first data state (e.g., state 0) and applying the current pulse 319 may program the memory cell to a second data state (e.g., state 1).

In some embodiments, the current pulse 318 may be applied to the memory cell for a longer amount of time than the current pulse 319. For example, the current pulse 318 may be applied to the memory cell for (e.g., have a duration of) at least 35 nanoseconds (ns) and the current pulse 319 may be applied to the memory cell for (e.g., have a duration of) 10 ns or less. For instance, the current pulse 318 may be applied to the memory cell for 45 ns and the current pulse 319 may be applied to the memory cell for 10 ns.

Further, in some embodiments, the current pulse 319 may have a greater magnitude (e.g., amplitude) than current pulse 318. For example, the current pulse 318 may have a magnitude of 25 microamps (μA) and the current pulse 319 may have a magnitude of 120 μA.

Figure 4A:
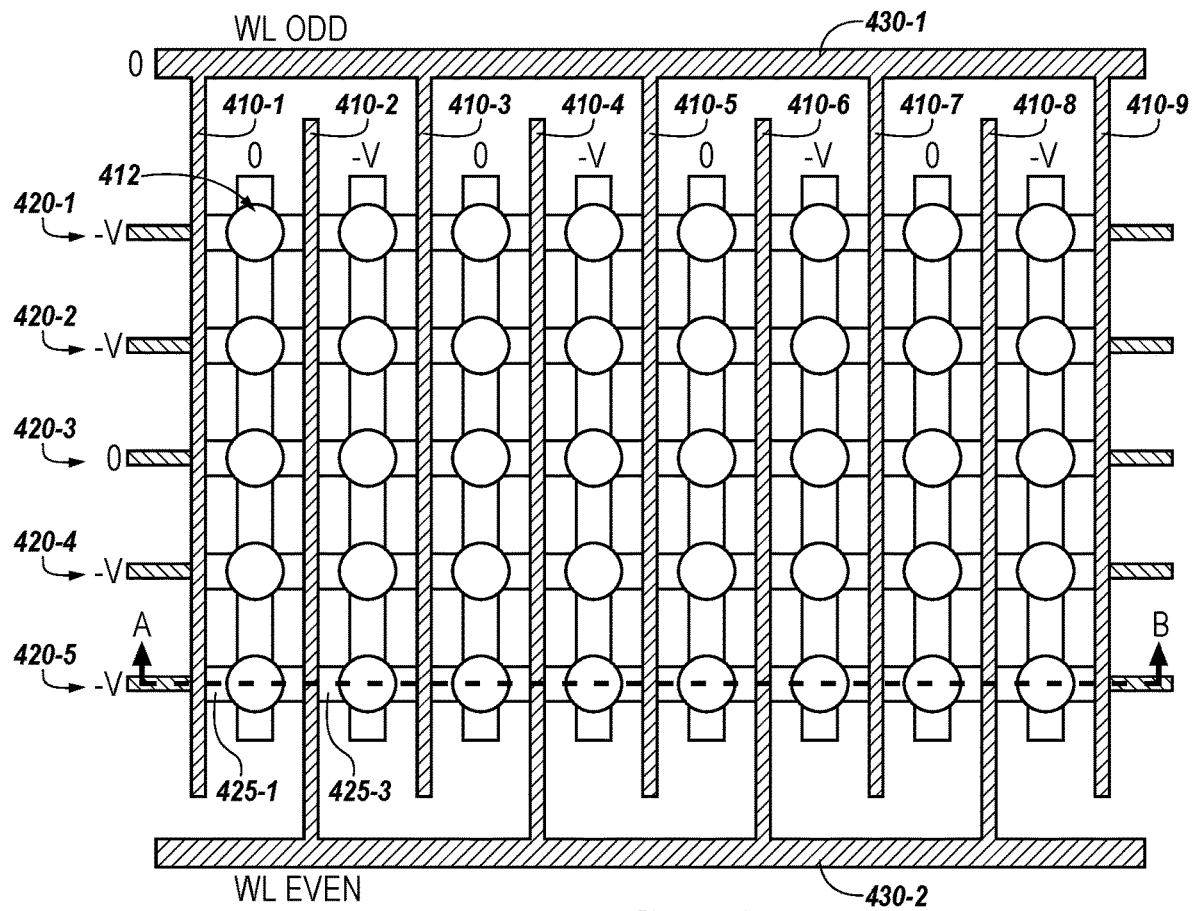
FIG. 4A is a top-down view of a memory array including a plurality of vertical pillars, in accordance with an embodiment of the present disclosure.

FIG. 4A is a top-down view of a memory array including a plurality of vertical pillars, in accordance with an embodiment of the present disclosure. The memory array shown in FIG. 4A includes access line drivers 430-1, 430-2, a plurality of conductive vertical pillars 412, sense lines 420-1, 420-2, 420-3, 420-4, and 420-5 (individually or collectively referred to as sense lines 420), and a plurality of access lines 410. For example, access lines 410-1, 410-3, 410-5, 410-7, and 410-9 can be coupled to (e.g., driven by) access line driver 430-1, and access lines 410-2, 410-4, 410-6, and 410-8 can be coupled to (e.g., driven by) access line driver 430-2. Access line driver 430-1 can be associated with an odd page of memory cells, and access line driver 430-2 can be associated with an even page of memory cells, for example.

FIG. 4A illustrates a plane of a single memory tile. As used herein, the term "memory tile" can refer to an array of horizontal access lines, vertical conductive pillars, and memory cells across multiple memory planes. As used herein, the term "memory plane" can refer to the access lines and memory cells on a same horizontal level of a memory array. Each memory plane can include a plurality of memory cells 425. In some embodiments, the memory device can include circuitry (not shown) to concurrently program a first memory cell (e.g., 425-1) to one of a first data state and a second data state and program a second memory cell (e.g., 425-3) to the other one of the first data state and the second data state by concurrently applying a first current pulse (e.g., current pulse 318 in FIG. 3) to the first memory cell 425-1 and a second current pulse (e.g., current pulse 319 in FIG. 3) to the second memory cell 425-3.

In some embodiments, the first current pulse can be one of a set pulse and a reset pulse and the second current pulse can be the other one of the set pulse and the reset pulse. In some embodiments, the duration of the set pulse can be greater than or equal to the duration of the reset pulse, the set pulse can have a lower magnitude than the reset pulse, and the set pulse and reset pulse can have a same polarity. Further, as shown in FIG. 4A, the first memory cell 425-1 and the second memory cell 425-3 can be included in the same memory plane of the same memory tile. In other embodiments, the first memory cell 425-1 and the second memory cell 425-3 can be located in different memory tiles.

Figure 4B:
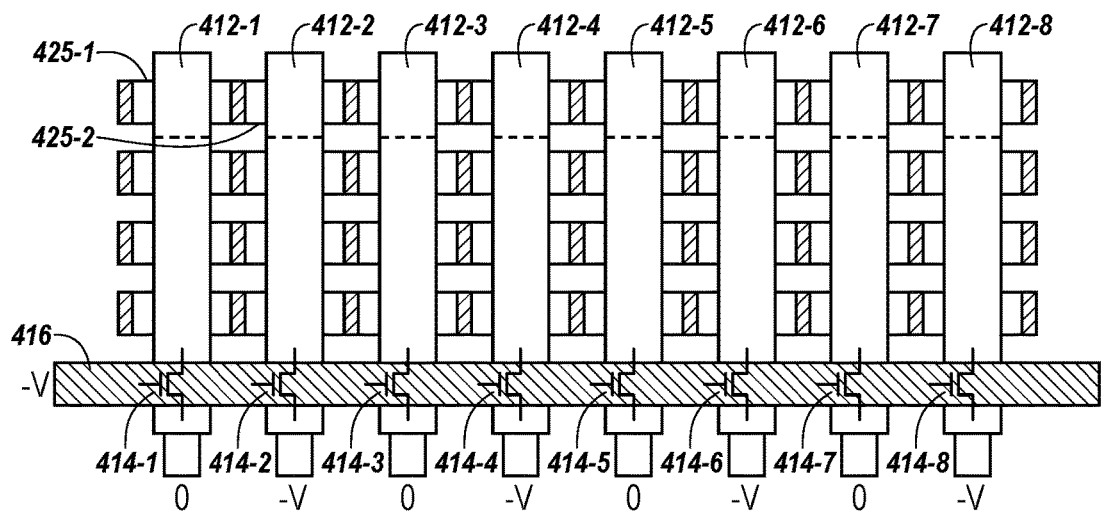
FIG. 4B is a cross-sectional view of the memory array of FIG. 4A, in accordance with an embodiment of the present disclosure.

FIG. 4B is a cross-sectional view, taken along cut-line A-B in FIG. 4A, of the memory array of FIG. 4A, in accordance with an embodiment of the present disclosure. The memory array shown in FIG. 4B includes vertical pillars 412-1, 412-2, 412-3, 412-4, 412-5, 412-6, 412-7, 412-8 (individually or collectively referred to as vertical pillars 412), memory cells 425, gate line 416, and transistors 414-1, 414-2, . . . , 414-8 (individually or collectively referred to as transistors 414).

In some embodiments, a first memory cell 425-1 can be coupled to a first vertical pillar 412-1 and a second memory cell 425-3 can be coupled to a second vertical pillar 412-2. A memory cell 425 can be programmed to a first data state or a second data state by selecting the memory cell and applying, while the memory cell is selected, a current pulse to the vertical pillar 412 coupled to the memory cell 425. The memory cell 425 can be selected by applying a current (e.g., an access line current) to the horizontal access line 410 coupled to the memory cell 425 and applying a current to the transistor 414 coupled to the vertical pillar 412 that is coupled to the memory cell 425. In some embodiments, the access line current can be continuously applied to the first vertical pillar 412-1 and the second vertical pillar 412-2. In some embodiments, the first memory cell 425-1 can be programmed to a first data state and the second memory cell 425-3 can be programmed to a second data state. The polarity of the memory cell 425 can be selected before selecting the memory cell 425.

In some embodiments, the first memory cell 425-1 and the second memory cell 425-3 can be programmed independently. As used herein, the term "programmed independently" refers to programming a memory cell separate from a different memory cell such that the programming of one memory cell does not affect the other memory cell. Since the first memory cell 425-1 and the second memory cell 425-3 can be programmed independently, the first memory cell 425-1 can be programmed to one of a first data state and a second data state and the second memory cell 425-3 can be programmed to the other one of the first data state and the second data state concurrently.

A memory device can concurrently program the first memory cell 425-1 and the second memory cell 425-3 by concurrently selecting the first memory cell 425-1 and the second memory cell 425-3 and applying, while the first memory cell 425-1 and the second memory cell 425-3 are selected, a first current pulse (e.g., current pulse 318 in FIG. 3A) to a first vertical pillar 412-1 that is coupled to the first memory cell 425-1 and a second current pulse (e.g., current pulse 319 in FIG. 3B) to the second vertical pillar 412-2 that is coupled to the second memory cell 425-3. In some embodiments, the current pulses can be applied to each respective vertical pillar 412 via a current mirror circuit (not pictured) coupled to that respective vertical pillar. A current mirror circuit can be a circuit that copies a current through one memory device by controlling the current in another memory device of a circuit, keeping the output current constant regardless of loading. In some embodiments, a different current mirror circuit can be coupled to each vertical pillar 412. Therefore, a first current mirror circuit can output a first current pulse to the first vertical pillar 412-1 and a second current mirror circuit can output a second current pulse to the second vertical pillar 412-2. A second current pulse can be applied to the second vertical pillar 412-2 while the first current pulse is being applied to the first vertical pillar 412-1.

In some embodiments, a program verify operation can be performed on the first memory cell 425-1 and the second memory cell 425-3 after programming the first memory cell 425-1 and the second memory cell 425-3. A program verify operation can refer to an operation in which voltage or current pulses of increasing magnitude are applied to a memory cell until the threshold voltage of the memory cell reaches a specified threshold voltage. For example, the program verify operation can be performed by alternately applying a plurality of first current pulses and a plurality of second pulses to the first memory cell 425-1, and alternately applying the plurality of first current pulses and the plurality of second current pulses to the second self-selecting memory cell 425-3. The program verify operation can increase the threshold voltage of the first memory cell 425-1 when the threshold voltage of the first memory cell is below a first selected threshold voltage and above a second selected threshold voltage and can increase the threshold voltage of the second memory cell 425-3 when the threshold voltage of the second memory cell 425-3 is below a third selected threshold voltage and above a fourth selected threshold voltage. In some embodiments, the first selected threshold voltage and the third selected threshold voltage can have the same magnitude and, in other embodiments, the first selected threshold voltage and the third selected threshold voltage can have different magnitudes. Further, the first selected threshold voltage and the third selected threshold voltage can have the same polarity. Since the programming of the memory cells 425 is not based on the polarity of the memory cells 425, the different current pulses can be applied to the memory cells 425 without preconditioning the memory cells 425. As used herein, the term "preconditioning" refers to applying a current pulse to a memory cell such that the memory cell is programmed in the same polarity as the intended data state of the memory cell.

Figure 5:
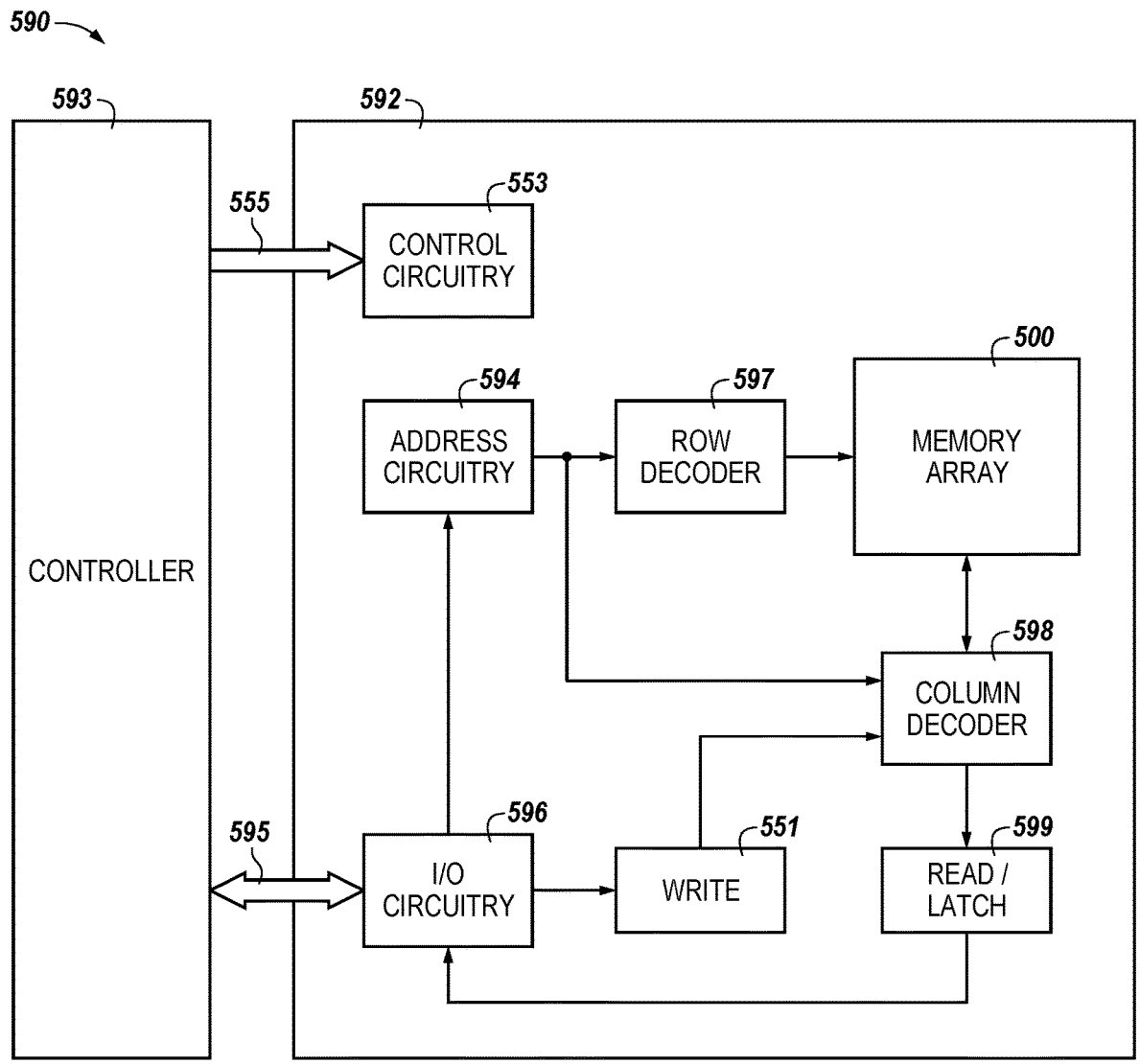
FIG. 5 is a block diagram illustration of an example apparatus, in accordance with an embodiment of the present disclosure.

FIG. 5 is a block diagram illustration of an example apparatus, such as an electronic memory system 590, in accordance with an embodiment of the present disclosure. Memory system 590 may include an apparatus, such as a memory device 592 and a controller 593, such as a memory controller (e.g., a host controller). Controller 593 might include a processor, for example. Controller 593 might be coupled to a host, for example, and may receive command signals (or commands), address signals (or addresses), and data signals (or data) from the host and may output data to the host. Controller 593 can perform one or more operations for unipolar programming of memory cells, in accordance with the present disclosure.

Memory device 592 includes a memory array 500 of memory cells. For example, memory array 500 may include one or more of the memory arrays, such as a vertical pillar array (e.g., one or more memory tiles), of memory cells discussed herein. Memory device 592 may include address circuitry 594 to latch address signals provided over I/O connections 595 through I/O circuitry 596. Address signals may be received and decoded by a row decoder 597 and a column decoder 598 to access the memory array 500.

Memory device 592 may sense (e.g., read) data in memory array 500 by sensing voltage and/or current changes in the memory array columns using sense/buffer circuitry that in some examples may be read/latch circuitry 599. Read/latch circuitry 599 may read and latch data from the memory array 500. Sensing circuitry (not shown) may include a number of sense amplifiers coupled to memory cells of memory array 500, which may operate in combination with the read/latch circuitry 599 to sense (e.g., read) memory states from targeted memory cells. I/O circuitry 596 may be included for bi-directional data communication over the I/O connections 595 with controller 593. Write circuitry 551 may be included to write data to memory array 500.

Control circuitry 553 may decode signals provided by control connections 555 from controller 593. These signals may include chip signals, write enable signals, and address latch signals that are used to control the operations on memory array 500, including data read and data write operations.

Control circuitry 553 may be included in controller 593, for example. Controller 593 may include other circuitry, firmware, software, or the like, whether alone or in combination. Controller 593 may be an external controller (e.g., in a separate die from the memory array 500, whether wholly or in part) or an internal controller (e.g., included in a same die as the memory array 500). For example, an internal controller might be a state machine or a memory sequencer.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a memory having a plurality of memory tiles, wherein:
  each of the plurality of memory tiles includes a plurality of memory planes; and
  a plurality of self-selecting memory cells are included in each of the plurality of memory planes; and
circuitry configured to concurrently program a first self-selecting memory cell of the plurality of self-selecting memory cells to a first data state or a second data state by applying a first current pulse to the first self-selecting memory cell and program a second self-selecting memory cell of the plurality of self-selecting memory cells to the other of the first data state or the second data state by applying a second current pulse to the second self-selecting memory cell, wherein:
  the first current pulse is a set pulse or a reset pulse and the second current pulse is the other of the set pulse or the reset pulse;
  the set pulse and the reset pulse have a negative polarity;
  the first data state is a different data state than the second state; and
  the first current pulse and the second current pulse are applied concurrently.

2. The apparatus of claim 1, wherein a duration of the set pulse is greater than or equal to a duration of the reset pulse.

3. The apparatus of claim 1, wherein the set pulse has a lower magnitude than the reset pulse.

4. The apparatus of claim 1, wherein the circuitry is configured to:
program the first self-selecting memory cell or the second self-selecting memory cell to the first data state by applying the set pulse to the first self-selecting memory cell or the second self-selecting memory cell; and
program the first self-selecting memory cell or the second self-selecting memory cell to the second data state by applying the reset pulse to the first self-selecting memory cell or the second self-selecting memory cell.

5. The apparatus of claim 1, wherein the first self-selecting memory cell and the second self-selecting memory cell are programmed to the first data state or the second data state based on a magnitude of the first current pulse or the second current pulse.

6. The apparatus of claim 5, wherein the first self-selecting memory cell and the second self-selecting memory cell are programmed to the first data state when the magnitude of the first current pulse or the second current pulse is below a threshold magnitude.

7. The apparatus of claim 5, wherein the first self-selecting memory cell and the second self-selecting memory cell are programmed to the second data state when the magnitude of the first current pulse or the second current pulse is above a threshold magnitude.

8. An apparatus, comprising:
a memory having a plurality of self-selecting memory cells; and
circuitry configured to concurrently program a first self-selecting memory cell of the plurality of self-selecting memory cells in a memory tile to one of a first data state and a second data state and program a second self-selecting memory cell of the plurality of self-selecting memory cells in the memory tile to the other one of the first data state and the second data state by concurrently applying a first current pulse to the first self-selecting memory cell and a second current pulse to the second self-selecting memory cell, wherein:
the first current pulse is one of a set pulse and a reset pulse;
the second current pulse is the other one of the set pulse and the reset pulse;
a duration of the set pulse is greater than or equal to a duration of the reset pulse;
the set pulse as a lower magnitude than the reset pulse;
the set pulse and the reset pulse have a negative polarity; and
the first data state is a different data state than the second data state.

9. The apparatus of claim 8, wherein:
the memory tile includes a plurality of memory planes; and
the plurality of self-selecting memory cells are included in each of the plurality of memory planes.

10. The apparatus of claim 9, wherein the first self-selecting memory cell and the second self-selecting memory cell are included in a same memory plane of the plurality of memory planes.

11. The apparatus of claim 8, wherein:
the memory includes a plurality of vertical pillars;
the first self-selecting memory cell is coupled to a first vertical pillar of the plurality of vertical pillars; and
the second self-selecting memory cell is coupled to a second vertical pillar of the plurality of vertical pillars.

12. The apparatus of claim 8, wherein the first self-selecting memory cell is programmed to the first data state and the second self-selecting memory cell is programmed to the second data state.

13. The apparatus of claim 8, wherein the first self-selecting memory cell and the second self-selecting memory cell are programmed independently.

14. A method of operating memory, comprising:
programming a first self-selecting memory cell of a particular memory tile to a first data state or a second data state and programming a second self-selecting memory cell of the particular memory tile to the other of the first data state or the second data by:
selecting the first self-selecting memory cell and the second self-selecting memory cell; and
concurrently applying, while the first self-selecting memory cell and the second self-selecting memory cell are selected, a first current pulse to a first vertical pillar that is coupled to the first self-selecting memory cell and a second current pulse to a second vertical pillar that is coupled to the second self-selecting memory cell, wherein:
the first current pulse is one of a set pulse or a reset pulse;
the second current pulse is the other one of the set pulse or the reset pulse;
a duration of the set pulse is greater than or equal to a duration of the reset pulse;
the set pulse has a lower magnitude than the reset pulse;
the set pulse and the reset pulse have a negative polarity; and
the first data state is a different data state than the second data state.

15. The method of claim 14, further comprising selecting the first self-selecting memory cell by applying the first current to a first horizontal access line coupled to the first self-selecting memory cell and selecting the second self-selecting memory cell by applying the second current to a second horizontal access line coupled to the second self-selecting memory cell.

16. The method of claim 14, further comprising selecting a polarity of the first self-selecting memory cell and the second self-selecting memory cell before selecting the first self-selecting memory cell and the second self-selecting memory cell.

17. The method of claim 14, wherein:
the first current pulse is applied to the first vertical pillar via a first current mirror circuit coupled to the first vertical pillar; and
the second current pulse is applied to the second vertical pillar via a second current mirror circuit coupled to the second vertical pillar.

18. The method of claim 17, wherein:
the first current mirror circuit outputs the first current pulse to the first vertical pillar; and
the second current mirror circuit outputs the second current pulse to the second vertical pillar.

19. A method of operating memory, comprising:
concurrently programming a first self-selecting memory cell to one of a first data state and a second data state and a second self-selecting memory cell to the other one of the first data state and the second data state by:
concurrently selecting the first self-selecting memory cell and the second self-selecting memory cell; and
concurrently applying, while the first self-selecting memory cell and the second self-selecting memory cell are selected, a first current pulse to a first vertical pillar that is coupled to the first self-selecting memory cell and a second current pulse to a second vertical pillar that is coupled to the second self-selecting memory cell, wherein:
the first current pulse is one of a set pulse and a reset pulse;
the second current pulse is the other one of the set pulse and the reset pulse;
a duration of the set pulse is greater than or equal to a duration of the reset pulse;
the set pulse has a lower magnitude than the reset current pulse;
the set pulse and the reset pulse have a negative polarity; and
the first data state is a different data state than the second data state.

20. The method of claim 19, further comprising performing a program verify operation on the first self-selecting memory cell and the second self-selecting memory cell after programming the first self-selecting memory cell and the second self-selecting memory cell.

21. The method of claim 20, further comprising performing the program verify operation by:
alternately applying a plurality of first current pulses and a plurality of second current pulses to the first self-selecting memory cell; and
alternately applying the plurality of first current pulses and the plurality of second current pulses to the second self-selecting memory cell.

22. The method of claim 21, wherein:
the program verify operation increases a threshold voltage of the first self-selecting memory cell when the threshold voltage of the first self-selecting memory cell is below a first selected threshold voltage and above a second selected threshold voltage; and
the program verify operation increases a threshold voltage of the second self-selecting memory cell when the threshold voltage of the second self-selecting memory cell is below a third selected threshold voltage and above a fourth selected threshold voltage.

23. The method of claim 19, further comprising continuously applying an access line current to access lines coupled to the first vertical pillar and the second vertical pillar.

* * * * *